United States Patent
Sorabji et al.

(10) Patent No.: US 9,859,162 B2
(45) Date of Patent: Jan. 2, 2018

(54) PERFORATION OF FILMS FOR SEPARATION

(71) Applicant: Alta Devices, Inc., Sunnyvale, CA (US)

(72) Inventors: Khurshed Sorabji, San Jose, CA (US); Daniel G. Patterson, Morgan Hill, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 0 days.

(21) Appl. No.: 14/663,683

(22) Filed: Mar. 20, 2015

(65) Prior Publication Data

US 2016/0079121 A1 Mar. 17, 2016

Related U.S. Application Data

(60) Provisional application No. 62/049,227, filed on Sep. 11, 2014.

(51) Int. Cl.
*H01L 21/00* (2006.01)
*H01L 21/78* (2006.01)
*H01L 23/00* (2006.01)

(52) U.S. Cl.
CPC ............ *H01L 21/78* (2013.01); *H01L 23/562* (2013.01); *H01L 2924/0002* (2013.01)

(58) Field of Classification Search
CPC .............................. H01L 21/78; H01L 23/564
USPC .......................................................... 438/462
See application file for complete search history.

(56) References Cited

U.S. PATENT DOCUMENTS

| | | | | |
|---|---|---|---|---|
| 5,817,569 A | * | 10/1998 | Brenner | H01L 21/78 257/E21.228 |
| 6,572,647 B1 | * | 6/2003 | Supper | A61F 2/91 623/1.15 |
| 7,375,009 B2 | * | 5/2008 | Chua | H01L 21/76898 257/E21.597 |
| 8,361,828 B1 | * | 1/2013 | Patterson | H01L 21/78 257/E21.599 |
| 8,728,849 B1 | | 5/2014 | Mattos et al. | |
| 9,184,067 B1 | * | 11/2015 | Kim | H01L 21/565 |
| 2011/0034007 A1 | | 2/2011 | Yodo et al. | |
| 2011/0037149 A1 | | 2/2011 | Fukuyo et al. | |
| 2011/0244659 A1 | | 10/2011 | Wang et al. | |
| 2011/0300691 A1 | | 12/2011 | Sakamoto et al. | |
| 2011/0300692 A1 | | 12/2011 | Gunster et al. | |
| 2012/0000502 A1 | * | 1/2012 | Wiedeman | H01L 31/048 136/244 |

(Continued)

*Primary Examiner* — Vu A Vu
(74) *Attorney, Agent, or Firm* — Arent Fox LLP

(57) ABSTRACT

A method for separation of semiconductor device cell units from fabricated large-area cell units, together with a corresponding tile unit structure, are provided in which the tile unit is cut along cell unit boundaries while leaving intact a set of specified tab sections distributed along the cell unit boundaries. The tile unit may be a multi-layer composite of a semiconductor layer with a conductive metallic base supported upon a polymer layer and adhered thereto by an adhesive film, wherein tab sections are cut completely through the semiconductor layer and its metallic base from above and may also be cut partially through the polymer layer from below, leaving at least a portion of the polymer layer in place at tab sections. Tile units can be handled such that component cell units are held together by the tab sections, until a physical final separation of selected cell units.

17 Claims, 3 Drawing Sheets

(56) References Cited

U.S. PATENT DOCUMENTS

| | | |
|---|---|---|
| 2012/0289026 A1 | 11/2012 | Ueno et al. |
| 2012/0289028 A1 | 11/2012 | Abatake |
| 2012/0329248 A1 | 12/2012 | Fukuyo et al. |
| 2013/0017668 A1 | 1/2013 | Lei et al. |
| 2013/0029476 A1 | 1/2013 | Weng et al. |
| 2013/0252403 A1 | 9/2013 | Fukuyo et al. |
| 2013/0330909 A1 | 12/2013 | Feng et al. |
| 2013/0344686 A1 | 12/2013 | Fukuyo et al. |
| 2014/0106544 A1 | 4/2014 | Chen et al. |
| 2014/0110867 A1 | 4/2014 | Chen |
| 2014/0120699 A1 | 5/2014 | Hua et al. |
| 2014/0145294 A1 | 5/2014 | Moeller et al. |

\* cited by examiner

PERFORATION OF FILMS FOR SEPARATION

CROSS-REFERENCE TO RELATED APPLICATION

This application claims priority under 35 U.S.C. 119(e) from prior U.S. provisional application 62/049,227, filed Sep. 11, 2014.

TECHNICAL FIELD

The invention relates to preparation of fabricated arrays of semiconductor devices for subsequent testing and handling, and in particular to arrangements for separating individual semiconductor devices from such arrays.

BACKGROUND ART

The process for creating semiconductor thin-film optoelectronic devices involves fabrication of relatively large-area units, or "tiles," which are then separated into smaller units, or "cells." Instruments used for this separation include mechanical cutting tools and lasers. These instruments take "tiles" and produce "cells", with no intermediate state. Such existing approaches utilizing fully-separated cells require expensive additional tooling for subsequent cell-level handling and processing.

There can be processing advantages to having a technique which effectively separates thin-film optoelectronic tiles into individual cells while allowing them to still be handled and processed as a single tile. A separation process that uses tooling that is already online with no additional material requirements would be desirable. A process that facilitates easy testing and handling of the cells is also desired.

SUMMARY DISCLOSURE

We describe a method for keeping cut cells in place and oriented within the tile's original geometry. A physical, final separation of cells from one another follows at a later time. The method would include leaving strategic material intact during cutting by skipping certain sections during the cut and leaving specific geometry of material ("tabs") that would easily pull apart. The individual cells are kept in their respective positions by the tabs during manufacturing processes such as testing, handling, and inventory control, prior to final separation. The tabs provide structural support so that the cut cells do not fall out of alignment from their original geometry, and can still be handled as a single tile-unit. The number, placement, and geometry of these tabs are optimized to balance holding strength with the need to eventually physically separate the selected cells by breaking or cutting those tabs.

This invention allows: a highly reliable cutting and separation process; simplified testing of individual cells; cell test AFTER cutting; convenient storage/inventory buildup of films after cutting and testing, but prior to separation; reliable tile-level handling along the manufacturing line; controllable and consistent separation force; selectivity of areas/geometry to be subjected to separation forces/stresses; and spatial control of cell support points prior to final separation (optimize end effector during robot handling).

DETAILED DESCRIPTION

Figure 1:
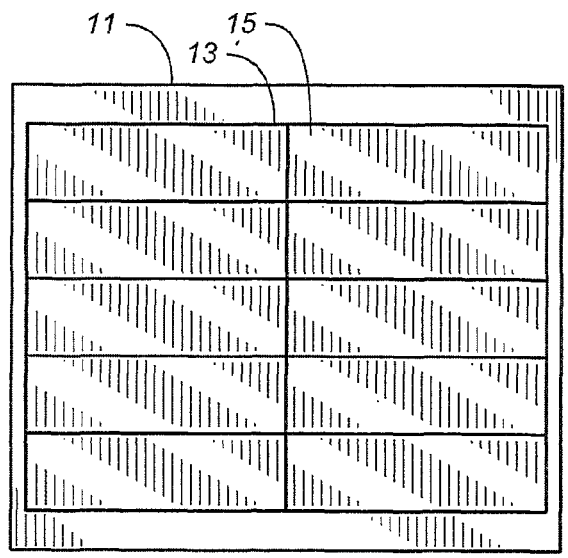
FIG. 1 shows a film of material on a frame assembly prior to laser separation.
Figure 5:
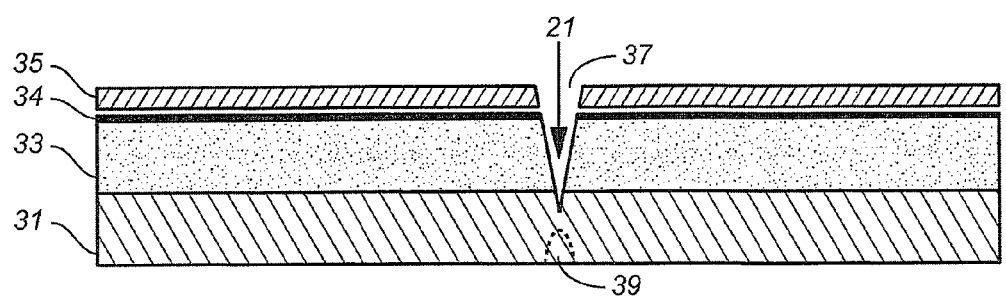
FIG. 5 shows a cross-section of an embodiment of the film of material after the laser separation with a tab seen to hold two adjacent cells in place.

With reference to FIG. 1, a film of material on a frame assembly 11 is seen in its state prior to any laser or mechanical separation. As seen in FIG. 5, tiles 13 may be a multi-layer composite of a thin semiconductor film 35, approximately 1 to 20 microns thick, that is supported by a polymer sheet 31, such as one composed of polyethylene terephthalate (PET), approximately 25 to 100 microns thick. A copper base 34 of the semiconductor film 35 may be bonded to the PET sheet 31 by an approximately 25 to 100 micron thick layer of an adhesive (PSA) 33. Returning to FIG. 1, tiles of material 13, e.g. of approximately 100 mm×100 mm size, can be created this way and patterned with a number of individual cells 15. The individual cells 15 must ultimately be separated from one another in order to sort them according to quality. A repeatable, accurate, fast, low cost method to free (separate) the cells would be very attractive.

Figure 2:
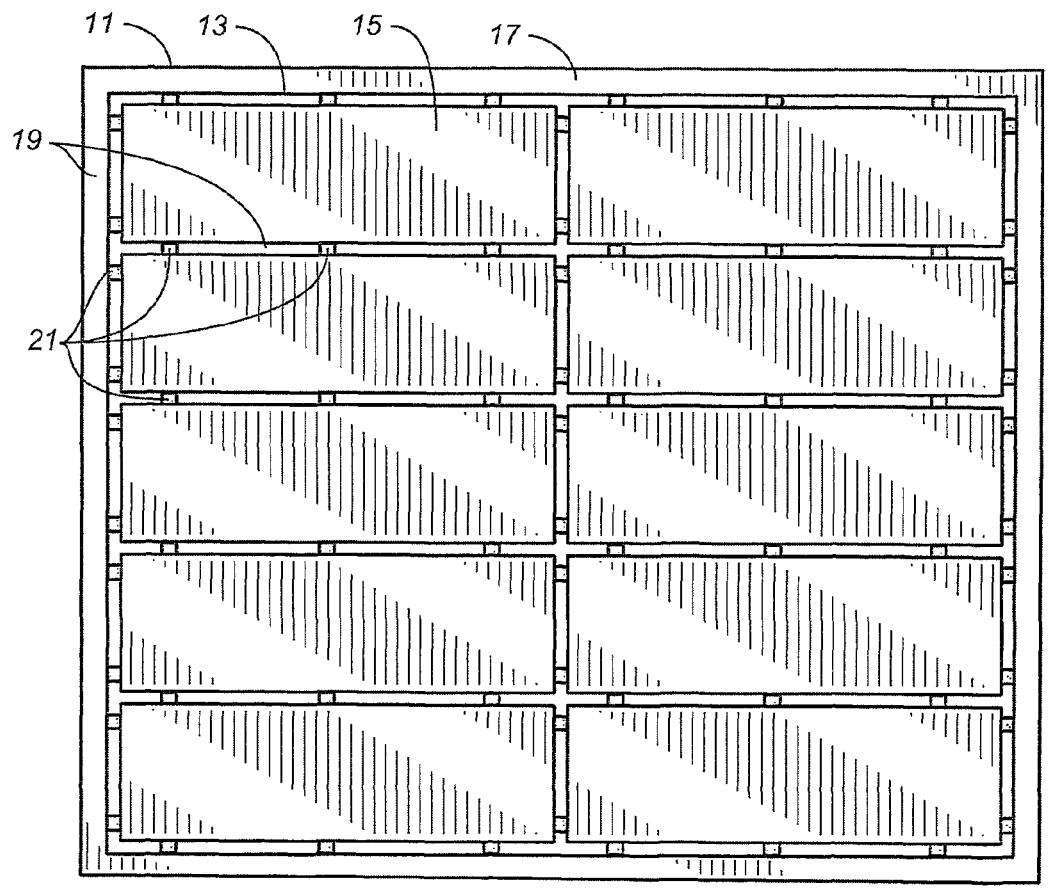
FIG. 2 shows the result of laser separation.

With reference to FIG. 2, the method would include the appropriate superposition of at least two cutting patterns: one without tabs and one with tabs. The first would cut through the tiles in unbroken lines, but not through the full depth of the material; the second would complete the through-cut in areas where there are no tabs, but not remove any further material along the tabs themselves, leaving a specific geometry of material that would easily separate in a follow-on step. One example would be a tab fixture 21 that would hold the cells 15 in place until each cell 15 is (or groups of cells are) intentionally pulled away from neighboring cells and/or frame borders 17. Alternatively, cells may be cut from their position by a mechanical or laser cut of the left-behind tab geometry. As seen in FIG. 2, as the result of laser separation, the film of material is still on the frame assembly 11 with cells 15 mostly separated (gaps 19 at cell borders), but with "tabs" 21 remaining to the hold the cells 15 in place. The number of tabs (represented here by example with 3 tabs on the longer sides and 2 tabs on the shorter sides of the cells) would depend upon the size of the cells 15 and the strength of the tabs 21. The frame 17 can be put in a chuck so selected cells 15 can be pulled from the frame 17 (and from other cells 15) by mechanically breaking those tabs 21 that hold the selected cells in place.

Figure 3:
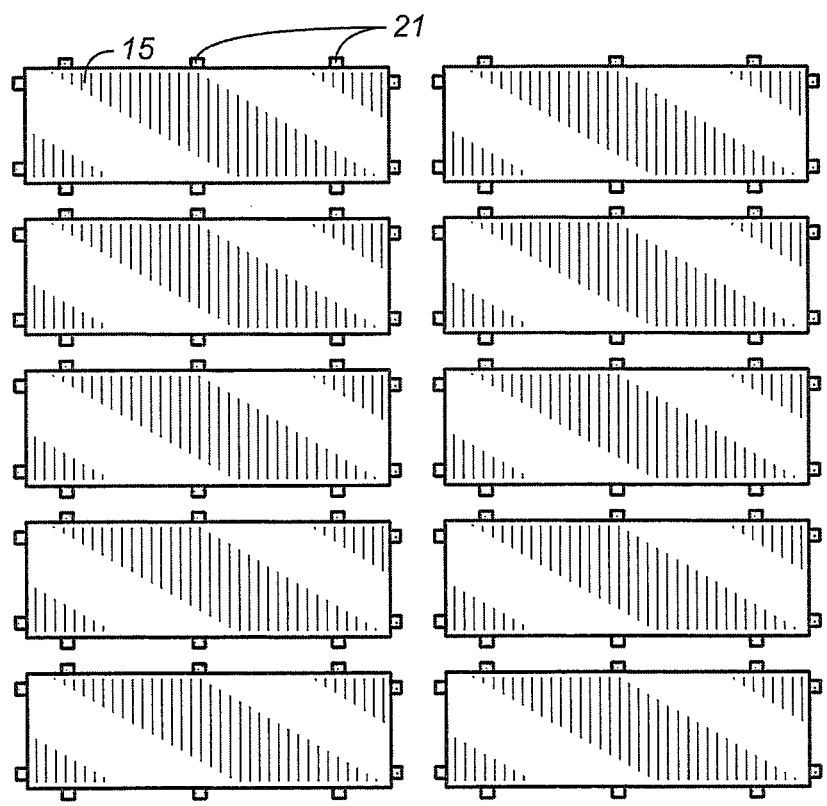
FIG. 3 shows the cells fully separated and with the outer frame removed.
Figure 4:
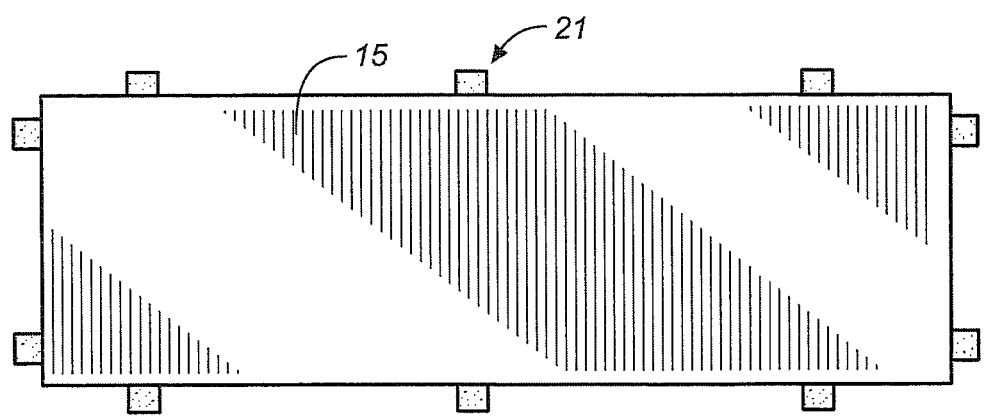
FIG. 4 is a close up of a single fully separated cell with residual tabs.

In FIG. 3, all of the cells 15 are now fully separated and with the outer frame 17 (in FIG. 2) completely removed and discarded. FIG. 4 shows a close up of a single fully separated cell 15 with residual tabs 21 (this is for illustration only—in our embodiments, the tabs are usually small enough, e.g. 200 microns wide or smaller, as to be invisible to the naked eye).

Returning to FIG. 5, the film of material after the laser separation has a tab 21 to hold two adjacent cells in place. The layer structure of the film material shows the thin film semiconductor 35 and metallic layer 34 attached to a PET sheet 31 using an adhesive 33. In this embodiment, laser cutting has completely cut through the metallic and semiconductor layers 34 and 35 (at top cut 37), and partially through the PET layer 31 (at bottom cut 39), but tabs 21 composed of some fraction of the PET layer 31 and possibly some fraction of the adhesive layer 33 have been left, by applying a tab pattern to the top cut 37, bottom cut 39, or both. (In non-tab areas, the top and bottom cuts "overlap" so that all layers are completely cut through.) Depending on the chosen adhesive material's strength, more of the polymer support 31 might also be left if needed. That is, the bottom cut 39 could be shallower or eliminated altogether. Because the semiconductor and metallic layers 34 and 35 are cleanly cut through at all points on the cell perimeter, deformation of the optoelectronic device during final separation can be avoided and the chances of damage reduced.

Additionally, the tab feature geometry, and the number and placement of tabs would require optimization (e.g. by routine trial-and-error testing) of holding strength versus force required for full separation. For example, tab strength is directly proportional to the length and thickness of the tab. Tab dimensions may be varied in cutting to adjust holding strength to a desired value. Tab strength could be increased if the cells were pulling apart before physical separation, or reduced if physical separation were unreliable.

Tab number, placement, and geometry are free variables, allowing the use of a larger number of small, weak tabs, or a smaller number of stronger tabs, depending on other process needs. For example, smaller and weaker tabs may be preferred near cell corners to minimize separation force there (as corners are mechanically weak and more easily damaged), while still allowing geometric control of tile material in that region. Larger and stronger tabs might be preferable along the sides of a cell because they allow separation force to be concentrated in areas unlikely to be damaged by the separation process.

For example, small tabs might be 75 microns wide, while large tabs might be 200 microns wide. Given four of each type on the perimeter of a 20×50 mm cell, they effectively constrain the cell even after 99.6% of the perimeter has been completely cut through.

What is claimed is:

1. A method for separation of semiconductor device cell units from fabricated large-area tile units, comprising:
    cutting completely through a single tile unit along areas of cell unit boundaries of multiple cell units in the tile unit, and cutting partially though the tile unit along different areas of cell unit boundaries, the cutting forming gaps between adjacent cell units while leaving partially intact a set of specified tab sections distributed along each side of the cell unit boundaries to keep the multiple cells attached to the tile unit, the tile unit being a multi-layer composite comprising a semiconductor layer with a conductive metallic base supported upon a polymer layer and adhered thereto with an adhesive film between the metallic base and polymer layer;
    handling the tile unit for at least one manufacturing process operation such that each individual cell unit remains held together by respective tab sections as part of the tile unit; and
    physically detaching, after the handling of the tile unit, at least one selected cell unit from the tile unit by disconnecting all tab sections that are along the boundary of that at least one selected cell unit.

2. The method as in claim 1, wherein cutting completely through the tile unit along areas of cell unit boundaries and cutting partially through the tile unit along different areas of cell unit boundaries cuts the multi-layer composite completely away except at the specified tab sections, the tab sections being formed by cutting through the semiconductor layer and its metallic base from above and by cutting through a portion of the polymer layer from below, leaving at least some of the polymer layer in place as one or more of the tabs sections until the physically detaching step, in non-tab areas of cell unit boundaries the respective cuts from above and from below overlapping such that cell unit boundaries are completely cut through in those non-tab areas to form the gaps.

3. The method as in claim 1, wherein cutting completely through the tile unit along areas of cell unit boundaries and cutting partially through the tile unit along different areas of cell unit boundaries cuts the multi-layer composite completely away except at the specified tab sections, the tab sections being formed by cutting through the semiconductor, metallic, adhesive and a portion of the polymer layer from above only, leaving at least some of the polymer layer in place as one or more of the tab sections until the physical detaching step, in non-tab areas of cell units boundaries the cut from above passing through entire polymer layer such that cell unit boundaries are completely cut through in those non-tab areas to form the gaps.

4. The method as in claim 1, wherein the polymer layer of the multi-layer composite has a thickness in a range from 25 to 100 microns.

5. The method as in claim 1, wherein the adhesive film of the multi-layer composite has a thickness in a range from 25 to 100 microns.

6. The method as in claim 1, wherein cutting completely through the tile unit along areas of cell unit boundaries comprises laser cutting.

7. The method as in claim 1, wherein one or more of a quantity of tab sections, a separation between tab sections, or a placement of tab sections formed by the cutting along areas of cell unit boundaries are selected to achieve a desired holding strength, separation force and force distribution required for detaching the cell units from the tile unit after the handling of the tile unit.

8. The method of claim 1, wherein an outer frame surrounds the cell units and further comprising discarding the outer frame after physically detaching all cell units from the tile unit.

9. The method of claim 1, wherein tabs sections near a corner of one or more of the cell units in the tile unit are smaller than tab sections along the sides of the respective cell unit.

10. A semiconductor device tile unit, comprising a plurality of semiconductor cell units having completely cut through along areas of cell unit boundaries and partially cut through along different areas of cell unit boundaries to form gaps between adjacent cell units, each partially cut through area disposed between a pair of completely cut through areas to form a tab section, the plurality of semiconductor cell units held together only by an intact set of specified tab sections distributed along the partially cut through areas of each side of cell unit boundaries, each cell unit being physically detachable from the tile unit and from other cell units by disconnecting of all tabs sections along its boundary, and the tile unit being a multi-layer composite comprising a semiconductor layer with a conductive metallic base supported upon a polymer layer and adhered thereto with an adhesive film between the metallic base and polymer layer.

11. The tile unit as in claim 10, wherein the areas along the cell unit boundaries having the multi-layer composite are completely cut away except at the specified tab sections, the tab sections being formed by a cut through the semiconductor layer and its metallic base from above and by at least a partial cut through the polymer layer from below, leaving at least some of the polymer layer in place as one or more of the tab sections, in non-tab areas of cell unit boundaries the respective cuts from above and from below overlapping such that cell unit boundaries are completely cut through in those non-tab areas to form the gaps.

12. The tile unit as in claim 10, wherein the areas along cell unit boundaries having the multi-layer composite are completely cut away except at the specified tab sections, the tab sections being formed by a cut through the semiconductor, metallic, adhesive and a portion of the polymer layer from above only, leaving at least some of the polymer layer in place as one or more of the tab sections, in non-tab areas of cell unit boundaries the cut from above passing through entire polymer layer such that cell unit boundaries are completely cut through in those non-tab areas to form the gaps.

13. The tile unit as in claim 10, wherein the polymer layer of the multi-layer composite has a thickness in a range from 25 to 100 microns.

14. The tile unit as in claim 10, wherein the adhesive film of the multi-layer composite has a thickness in a range from 25 to 100 microns.

15. The tile unit as in claim 10, wherein one or more of a quantity of tab sections, a separation between tab sections, or a placement of tab sections formed by cutting along areas of cell unit boundaries are selected to achieve a desired holding strength, separation force and force distribution required for detaching the cell units from the tile unit.

16. The tile unit as in claim 10, further comprising an outer frame surrounding the plurality of semiconductor cell units, the outer frame discarded upon physical detachment of all cell units from the tile unit.

17. The tile unit as in claim 10, wherein tabs sections near a corner of one or more of the cell units in the tile unit are smaller than tab sections along the sides of the respective cell unit.

\* \* \* \* \*